United States Patent
Cohen et al.

(10) Patent No.: US 9,728,444 B2
(45) Date of Patent: Aug. 8, 2017

(54) REACTIVE ION ETCHING ASSISTED LIFT-OFF PROCESSES FOR FABRICATING THICK METALLIZATION PATTERNS WITH TIGHT PITCH

(71) Applicant: International Business Machines Corporation, Armonk, NY (US)

(72) Inventors: Guy M. Cohen, Ossining, NY (US); Sebastian U. Engelmann, White Plains, NY (US); Steve Holmes, Ossining, NY (US); Jyotica V. Patel, Port Chester, NY (US)

(73) Assignee: International Business Machines Corporation, Armonk, NY (US)

(*) Notice: Subject to any disclaimer, the term of this patent is extended or adjusted under 35 U.S.C. 154(b) by 8 days.

(21) Appl. No.: 14/985,900

(22) Filed: Dec. 31, 2015

(65) Prior Publication Data

US 2017/0194195 A1    Jul. 6, 2017

(51) Int. Cl.
*G03F 7/20* (2006.01)
*H01R 43/00* (2006.01)
(Continued)

(52) U.S. Cl.
CPC .... *H01L 21/76802* (2013.01); *H01L 21/0272* (2013.01); *H01L 21/0276* (2013.01);
(Continued)

(58) Field of Classification Search
CPC ......... H01L 33/20; H01L 22/12; H01L 22/20; H01L 21/02019; H01L 21/30604; H01L 21/30625; H01L 21/3063; H01L 21/31055; H01L 21/31111; H01L 21/31133; H01L 21/32133; H01L 21/465; H01L 2224/03614; C25F 3/12
See application file for complete search history.

(56) References Cited

U.S. PATENT DOCUMENTS

| 4,372,034 A | * | 2/1983 | Bohr | H01L 21/31111 |
| | | | | 257/E21.251 |
| 4,440,804 A | * | 4/1984 | Milgram | H01L 21/0272 |
| | | | | 257/E21.025 |

(Continued)

*Primary Examiner* — Mary Wilczewski
*Assistant Examiner* — Tsz Chiu
(74) *Attorney, Agent, or Firm* — Vazken Alexanian; Ryan, Mason & Lewis, LLP

(57) ABSTRACT

Lift-off methods for fabricating metal line patterns on a substrate are provided. For example, a method to fabricate a device includes forming a sacrificial layer on a substrate and forming a photoresist mask over the sacrificial layer, isotropically etching a portion of the sacrificial layer exposed through an opening of the photoresist mask to form an undercut region in the sacrificial layer below the photoresist mask, wherein the undercut region defines an overhang structure, and anisotropically etching a portion of the sacrificial layer exposed through the opening of the photoresist mask to form an opening through the sacrificial layer down to the substrate. Metallic material is deposited to cover the photoresist mask and to at least partially fill the opening formed in the sacrificial layer without coating the overhang structure with metallic material. The sacrificial layer is dissolved to lift-off the metallic material covering the photoresist mask.

10 Claims, 15 Drawing Sheets

(51) Int. Cl.
  *H05K 1/03*    (2006.01)
  *H01L 21/768*  (2006.01)
  *H01L 21/027*  (2006.01)
  *H01L 21/311*  (2006.01)
  *H01L 23/528*  (2006.01)

(52) U.S. Cl.
  CPC .. *H01L 21/31116* (2013.01); *H01L 21/31144* (2013.01); *H01L 21/76877* (2013.01); *H01L 23/528* (2013.01)

(56) References Cited

U.S. PATENT DOCUMENTS

| | | | |
|---|---|---|---|
| 6,213,386 B1 | 4/2001 | Inoue et al. | |
| 6,355,567 B1* | 3/2002 | Halle | H01L 21/76804 257/E21.252 |
| 6,373,123 B1* | 4/2002 | Clampitt | H01L 21/76232 257/401 |
| 6,514,805 B2* | 2/2003 | Xu | H01L 21/76229 257/E21.548 |
| 6,764,955 B2* | 7/2004 | Jeon | H01L 21/31111 257/E21.578 |
| 9,012,132 B2* | 4/2015 | Chang | G03F 7/20 430/325 |
| 2005/0064708 A1* | 3/2005 | May | H01L 21/76844 438/687 |
| 2009/0133908 A1* | 5/2009 | Goodner | H05K 3/243 174/255 |
| 2011/0256700 A1* | 10/2011 | Chang | H01L 21/82345 438/585 |

* cited by examiner

200

400

REACTIVE ION ETCHING ASSISTED LIFT-OFF PROCESSES FOR FABRICATING THICK METALLIZATION PATTERNS WITH TIGHT PITCH

TECHNICAL FIELD

This disclosure generally relates to semiconductor fabrication techniques and, in particular, lift-off techniques for fabricating patterned structures on a substrate.

BACKGROUND

In the field of semiconductor fabrication, lift-off techniques are commonly utilized to pattern metal lines and other structures on a surface of a substrate (e.g. wafer). While lift-off techniques are typically not utilized in the manufacturing of VLSI circuits, lift-off techniques can be very useful in early stages of product development and prototyping. A lift-off process is essentially an "additive" technique, as opposed to a "subtracting" technique such as etching. For example, in a typical lift-off process, a layer of sacrificial material is coated over a substrate and then covered by a layer of photoresist material. The photoresist layer is lithographically patterned to form a photoresist mask, and the layer of sacrificial material is isotropically etched via a wet etch process, for example, using the photoresist mask as an etch mask. The isotropic wet etch serves to vertically etch the exposed portions of the sacrificial material down to the substrate, as well as laterally etch the layer of sacrificial material to undercut the photoresist mask and form a photoresist overhang structure. A metal is then non-conformally deposited over the substrate, coving the photoresist mask and filling in the etched openings in the layer of sacrificial material. Due to the photoresist overhang, the deposited metal layer is discontinuous at the undercut regions where the sacrificial layer was removed from under the photoresist mask. This discontinuity in the metal layer allows "lift-off" the overburden metal on the photoresist mask by dissolving the photoresist mask with a solvent. With this process the overburden metal that is disposed on the photoresist mask is removed, while the metal that was deposited over the exposed substrate remains.

With a conventional lift-off method as outlined above, a thickness of the deposited metal film cannot substantially exceed the thickness of the sacrificial layer. If the deposited metal film is too thick, the metal film would be continuous and prevent the photoresist from being dissolved to achieve lift-off of the overburden metallic material. Furthermore, since the sacrificial material is removed using an isotropic etch process, the use of a thick sacrificial material, which is needed to form a thick metal film on the substrate, will require the formation of a large lateral overhang, since the vertical etch rate of the sacrificial material is the same as lateral etch rate of the sacrificial material. This isotropic etch process effectively places a limit on how close two adjacent metal lines can be formed. More specifically, the minimum distance between two metal lines must be at least 2× the length of the photoresist overhang which, due to the undercutting of the sacrificial material by virtue of the isotropic etch process, is 2× the thickness of the sacrificial material, or otherwise the portion of the photoresist material between the two metal lines would collapse.

SUMMARY

Embodiments of the invention generally include lift-off methods for fabricating metal line patterns or other patterned structures on a substrate, as well as semiconductor structures that are formed using such lift-off techniques. For example, one embodiment of the invention includes a method to fabricate a device. The method includes forming a sacrificial layer on a substrate and forming a photoresist mask over the sacrificial layer, wherein the photoresist mask comprises an opening. The method further includes isotropically etching a portion of the sacrificial layer exposed through the opening of the photoresist mask to form an undercut region in the sacrificial layer below the photoresist mask, wherein the undercut region defines an overhang structure, and anisotropically etching a portion of the sacrificial layer exposed through the opening of the photoresist mask to form an opening through the sacrificial layer down to the substrate. Metallic material is deposited to cover the photoresist mask and to at least partially fill the opening formed in the sacrificial layer without coating the overhang structure with metallic material. The sacrificial layer is dissolved to lift-off the metallic material covering the photoresist mask.

Other embodiments will be described in the following detailed description of embodiments, which is to be read in conjunction with the accompanying figures.

BRIEF DESCRIPTION OF THE DRAWINGS

FIGS. 1A, 1B, 1C, 1D, and 1E schematically illustrate a lift-off method for patterning metallic lines on a substrate, according to an embodiment of the invention, wherein:

FIG. 1A is cross-sectional schematic view of a semiconductor structure at an intermediate stage of fabrication in which a layer of sacrificial material and a layer of photoresist material are formed on the substrate;

FIG. 1B is cross-sectional schematic view of the semiconductor structure of FIG. 1A after photolithographically patterning the photoresist layer to form a photoresist mask having an opening, and isotropically etching a portion of the sacrificial layer exposed through the opening of the photoresist mask to form a photoresist overhang structure;

FIG. 1C is cross-sectional schematic view of the semiconductor structure of FIG. 1B after anisotropically etching a portion of the sacrificial layer exposed through the opening in the photoresist mask to form an opening in the sacrificial layer down to the substrate;

FIG. 1D is cross-sectional schematic view of the semiconductor structure of FIG. 1C after depositing one or more non-conformal layers of metallic material over the semiconductor structure to at least partially fill the opening in the sacrificial layer with metallic material; and FIG. 1E is cross-sectional schematic view of the semiconductor structure of FIG. 1D after dissolving the sacrificial layer and/or the photoresist mask to cause lift-off of the metallic material disposed on the photoresist layer.

FIGS. 2A, 2B, 2C, 2D, 2E, and 2F schematically illustrate a lift-off method for patterning metallic lines on a substrate, according to another embodiment of the invention, wherein:

FIG. 2A is cross-sectional schematic view of a semiconductor structure at an intermediate stage of fabrication in which first and second layers of sacrificial material and a layer of photoresist material are formed on the substrate;

FIG. 2B is cross-sectional schematic view of the semiconductor structure of FIG. 2A after photolithographically patterning the photoresist layer to form a photoresist mask having an opening;

FIG. 2C is cross-sectional schematic view of the semiconductor structure of FIG. 2B after anisotropically etching portions of the first and second layers of sacrificial material, which are exposed through the opening in the photoresist mask, to form an opening down to the substrate;

FIG. 2D is cross-sectional schematic view of the semiconductor structure of FIG. 2C after laterally etching exposed sidewalls of the opening in the first sacrificial layer to form an undercut region in the first sacrificial layer below the photoresist mask and the second sacrificial layer and thereby form an overhang structure;

FIG. 2E is cross-sectional schematic view of the semiconductor structure of FIG. 2D after depositing a non-conformal layer of metallic material over the semiconductor structure to partially fill the opening in the first layer of sacrificial material layer with metallic material; and FIG. 2F is cross-sectional schematic view of the semiconductor structure of FIG. 2E after dissolving the first layer of sacrificial material to cause lift-off of the metallic material disposed on the photoresist mask.

FIGS. 3A, 3B, 3C, 3D, 3E, and 3F schematically illustrate a lift-off method for patterning metallic lines on a substrate, according to yet another embodiment of the invention, wherein:

FIG. 3A is cross-sectional schematic view of a semiconductor structure at an intermediate stage of fabrication in which first and second layers of sacrificial material and a layer of photoresist material are formed on the substrate;

FIG. 3B is cross-sectional schematic view of the semiconductor structure of FIG. 3A after photolithographically patterning the layer of photoresist material and the second layer of sacrificial material to form an opening through the layer of photoresist material and the second layer of sacrificial material, down to the first layer of sacrificial material;

FIG. 3C is cross-sectional schematic view of the semiconductor structure of FIG. 3B after anisotropically etching a portion of the first layer of sacrificial material, which is exposed through the opening formed in the layer of photoresist material and the second layer of sacrificial material, down to the substrate;

FIG. 3D is cross-sectional schematic view of the semiconductor structure of FIG. 3C after laterally etching the first layer of sacrificial material to form an undercut region in the first layer of sacrificial material below the layer of photoresist material and the second layer of sacrificial layer, and thereby form an overhang structure;

FIG. 3E is cross-sectional schematic view of the semiconductor structure of FIG. 3D after depositing a non-conformal layer of metallic material over the semiconductor structure to partially fill the opening in the first layer of sacrificial material layer with metallic material; and FIG. 3F is cross-sectional schematic view of the semiconductor structure of FIG. 3E after dissolving the first layer of sacrificial material to cause lift-off of the metallic material disposed on the photoresist mask.

FIGS. 4A, 4B, 4C, 4D, 4E, 4F and 4G schematically illustrate a lift-off method for patterning metallic lines on a substrate, according to yet another embodiment of the invention, wherein:

FIG. 4A is cross-sectional schematic view of a semiconductor structure at an intermediate stage of fabrication in which first and second layers of sacrificial material, a hard mask layer, and a layer of photoresist material are formed on the substrate;

FIG. 4B is cross-sectional schematic view of the semiconductor structure of FIG. 4A after photolithographically patterning the layer of photoresist material to form a photoresist mask having an opening that exposes the hard mask layer;

FIG. 4C is cross-sectional schematic view of the semiconductor structure of FIG. 4B after anisotropically etching a portion of the hard mask layer, which is exposed through the opening of the photoresist mask, to form an opening in the hard mask layer down to the second layer of sacrificial material;

FIG. 4D is cross-sectional schematic view of the semiconductor structure of FIG. 4C after anisotropically etching portions of the first and second layers of sacrificial material, which are exposed through the opening of the hard mask layer, down to the substrate;

FIG. 4E is cross-sectional schematic view of the semiconductor structure of FIG. 4D after laterally etching the first and second layers of sacrificial material to form an undercut region in the first and second layers of sacrificial material below the photoresist mask and the hard mask layer;

FIG. 4F is cross-sectional schematic view of the semiconductor structure of FIG. 4E after depositing a non-conformal layer of metallic material over the semiconductor structure to partially fill the opening in the first layer of sacrificial material layer with metallic material; and FIG. 4G is cross-sectional schematic view of the semiconductor structure of FIG. 4F after dissolving the first layer of sacrificial material to cause lift-off of the metallic material disposed on the photoresist mask.

DETAILED DESCRIPTION OF EMBODIMENTS

Embodiments will now be discussed in further detail with regard to various lift-off techniques for fabricating metal line patterns or other patterned structures on a substrate, as well as semiconductor structures that are formed using such lift-off techniques. As explained in further detail below, in one example implementation, lift-off techniques according to embodiments of the invention utilize anisotropic etching in conjunction with isotropic etching of thick sacrificial material layers to effectively decouple an amount of lateral etching (e.g., undercut length) of one or more sacrificial material layers (used in the lift-off process) from a total thickness of such sacrificial layer(s), thereby enabling the formation of relatively thick metallization lines at tight pitch.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

Figure 1A:
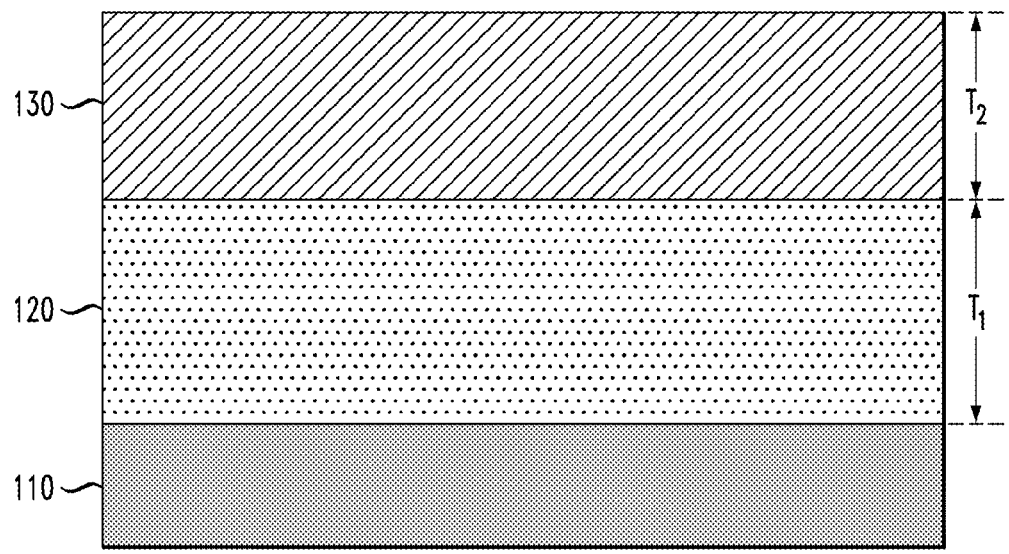

FIGS. 1A, 1B, 1C, and 1D schematically illustrate a lift-off method for patterning metallic lines on a substrate, according to an embodiment of the invention. Referring initially to FIG. 1A, a semiconductor structure 100 is shown at an intermediate stage of fabrication in which the semiconductor structure 100 comprises a substrate 110, with a layer of sacrificial material 120 formed over the substrate 110, and a layer of photoresist material 130 formed over the layer of sacrificial material 120. In one embodiment, the substrate 110 comprises a bulk semiconductor substrate formed of, e.g., silicon, or other types of semiconductor substrate materials that are commonly used in bulk semiconductor fabrication processes such as germanium, silicon-germanium alloy, silicon carbide, silicon-germanium carbide alloy, or compound semiconductor materials (e.g. III-V and II-VI). In another embodiment, the substrate 110 may comprise a SOI (silicon on insulator) substrate, which comprises an insulating layer (e.g., oxide layer) disposed between a base semiconductor substrate (e.g., silicon substrate) and an active semiconductor layer (e.g., active silicon layer) in which active circuit components are formed. The substrate 110 may further comprise a FEOL (front-end of line) structure formed on the bulk or SOI substrate, which comprises a plurality of circuit components (e.g., transistors, resistors, etc.) that form an integrated circuit. A PMD (pre-metal deposition) insulating layer may be formed over the FEOL structure having conductive plugs that make contact to device terminals. The exemplary lift-off techniques discussed herein can be implemented to form a BEOL (back-end-of-line) metallization structure that to interconnect the circuitry of the FEOL structure.

In one embodiment of the invention, the sacrificial layer 120 comprises one or more layers of DBARC (developer-soluble bottom anti-reflective coating) material formed on the substrate 110. The sacrificial layer 120 is formed with a thickness $T_1$ that is greater than a target thickness of a metal stack which is subsequently formed (e.g., FIG. 1D). Depending on type of sacrificial material used (e.g., DBARC) and the desired thickness $T_1$, two or more layers of sacrificial material may be sequentially deposited and processed to form the sacrificial layer 120. For example, in one embodiment of the invention, the sacrificial layer 120 may be formed of two layers of 90 nm DBARC material which are deposited using spin coating methods. After forming a layer of DBARC material, the DBARC material is baked to remove solvents. The higher the baking temperature, the slower the DBARC layer will dissolve in a developer solution. For example, for a commercially available 248 nm DBARC material of the type DS-K101, a bake temperature of 180° C. for 60 s will result in a removal (dissolution) rate of about 30 nm/min of DBARC in a TMAH developer (e.g., TMAH OPD7262) at room temperature. The deposition and baking steps are repeated for each layer of DBARC material that is used to form the sacrificial layer 120.

The photoresist layer 130 may be formed of any suitable commercially available photoresist material. The photoresist layer 130 is formed with a thickness $T_2$ which is sufficient to prevent the photoresist layer 130 from being completely depleted during a subsequent anisotropic etch process (e.g., RIE) which is performed to etch the sacrificial layer 120 (e.g., FIG. 1C).

Figure 1B:
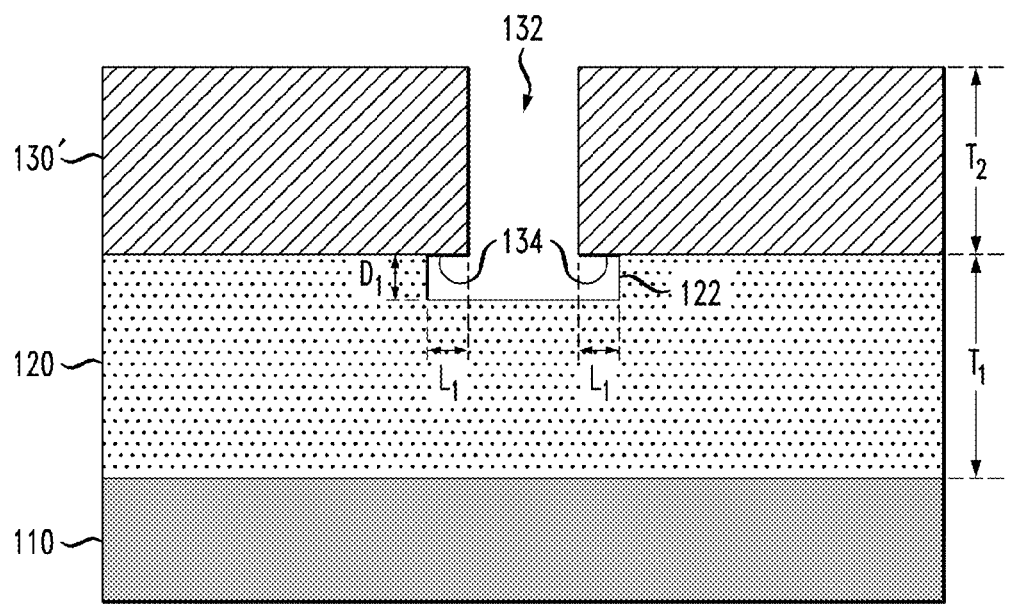

A next phase in the lift-off process comprises forming a photoresist mask, and using the photoresist mask to etch the sacrificial layer 120. For example, FIG. 1B is cross-sectional schematic view of the semiconductor structure of FIG. 1A after photolithographically patterning the photoresist layer 130 to form a photoresist mask 130' having an opening 132, and isotropically etching away a portion 122 of the sacrificial layer 120 that is exposed through the opening 132 of the photoresist mask 130' to form an overhang structure 134. The photoresist mask 130' can be formed using known techniques. For example, with a positive resist type, a portion of the photoresist layer 130 is exposed to UV light, for example, through a mask having transparent regions that define a target pattern of metallization lines/features. The portion of the photoresist layer 130 that is exposed to light becomes soluble to a photoresist developer, whereas the portion of the photoresist that is unexposed to UV light remains insoluble to the photoresist developer. Following the exposure process, the photoresist layer 130 is developed using a suitable photoresist developer solution. When the photoresist material is a positive resist type, the portion of the photoresist material layer 130 that was exposed to the UV light is dissolved by the photoresist developer solution.

In one embodiment of the invention, the photoresist developer solution that is utilized to develop the photoresist layer 130 is also capable of dissolving the sacrificial layer 120. In this regard, following the development of the photoresist layer 130 to form the photoresist mask 130', the development time is extended for some additional time as desired to dissolve the portion 122 of the sacrificial layer 120 that is exposed through the opening 132 of the photoresist mask 130' and form the photoresist overhang structure 134. More specifically, as schematically illustrated in FIG. 1B, the photoresist developer solution isotropically etches the exposed portion of the sacrificial layer 120 (e.g., DBARC material) equally in all directions (vertically and laterally) to form the etched portion 122. As such, when the exposed portion of the sacrificial layer 120 is vertically etched to a depth of $D_1$, the exposed portion of the sacrificial layer 120 is also laterally etched to form an undercut of length $L_1$ in the sacrificial layer 120 below the photoresist mask 130' around a bottom periphery of the opening 132 (wherein $D_1$ and $L_1$ are substantially equal), thereby forming the photoresist overhang structure 134. In one embodiment of the invention, the sacrificial layer 120 is laterally etched to achieve an undercut length $L_1$ of about 15 nm to about 30 nm, for example, which creates a small photoresist overhang structure 134 that is sufficient to effect lift-off. It is to be noted that while the isotropically etched portion 122 is depicted as being rectangular-shaped, in practice, the etched portion 122 would resemble a quarter of a circle by virtue of the isotropic etching. In any event, the isotropic etching results in the formation of the photoresist overhang structure 134 shown in FIG. 1B.

Figure 1C:
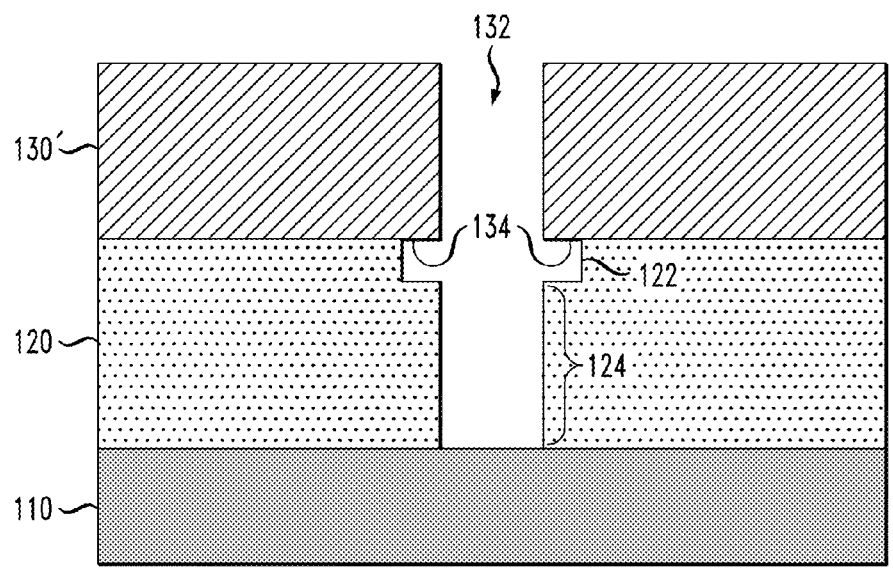

After isotropically etching the sacrificial layer 120 to form the photoresist overhang structure 134, the sacrificial layer 120 is anisotropically etched using the photoresist mask 130' to form an opening through the sacrificial layer 120 down to the substrate 110. For example, FIG. 1C is cross-sectional schematic view of the semiconductor structure of FIG. 1B after anisotropically etching a portion of the sacrificial layer 120 exposed through the opening 132 in the photoresist mask 130' to form an opening 124 in the sacrificial layer 120 down to the substrate 110. In one embodiment of the invention, the sacrificial layer 120 is anisotropically etched using a reactive ion etch (RIE) process so that the sacrificial layer 120 (e.g., DBARC material) is directionally etched (in a vertical direction) from the top down to the substrate 110 with minimal sideways etching of the sacrificial layer 120. In one embodiment, an endpoint detection system is utilized to monitor the RIE process and terminate the RIE process when, for example, the end point detection system measures a CO signal at a wavelength of 484 nm.

The RIE process enables the opening 132 of the photoresist mask 130' to be transferred to the sacrificial layer 120 to form the opening 124 in the sacrificial layer 124, while the photoresist overhang structure 134 formed by the laterally etched portion 122 of the DBARC material to remain essentially unchanged during the RIE process (due to the RIE being vertically directional). In one embodiment of the invention, when the sacrificial layer 120 is formed of a DBARC material, an oxygen ($O_2$) based chemistry may be utilized to ensure that the sidewalls of the DBARC material (which define the opening 124) remain clean and are not chemically modified to allow additional dissolution of the sacrificial DBARC material in a developer solution.

Figure 1D:
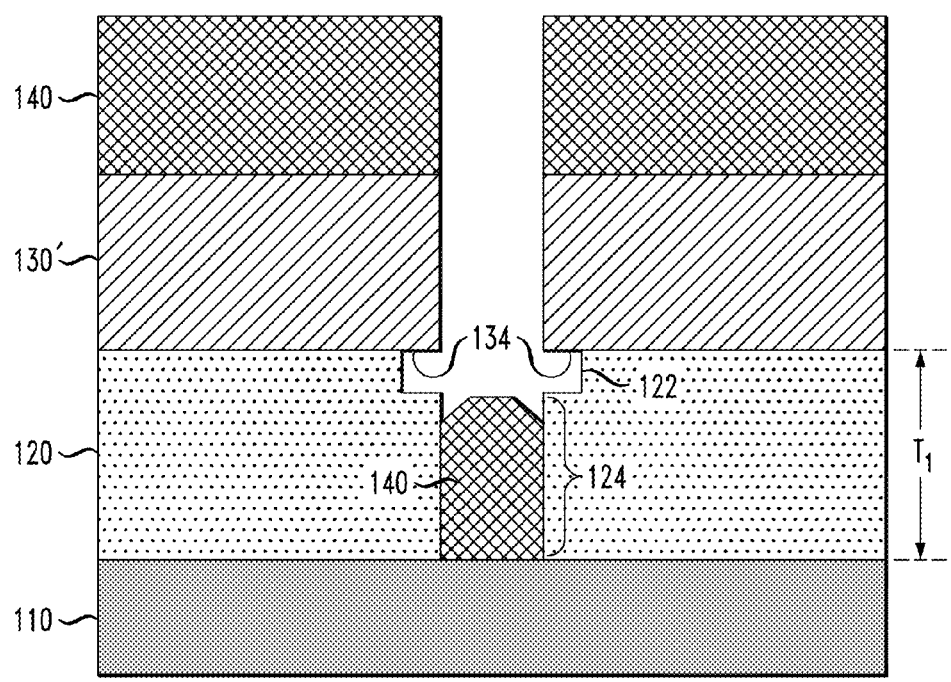
Figure 1E:
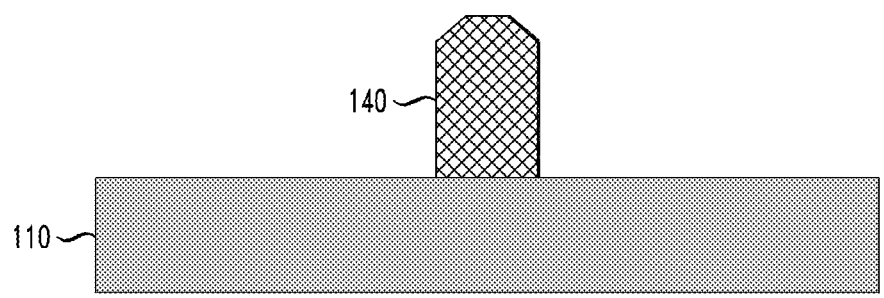

A next phase in the lift-off process comprises depositing metallic material over the semiconductor structure to FIG. 1C to at least partially (or completely) fill the opening 124 in the sacrificial layer 120 with metallic material that forms metal lines. In particular, FIG. 1D is cross-sectional schematic view of the semiconductor structure of FIG. 1C after depositing one or more non-conformal layers of metallic material 140 over the semiconductor structure to at least partially fill the opening 124 in the sacrificial layer 120 with the metallic material 140. The portion of the metallic material 140 that fills the opening 124 in the sacrificial layer 120 forms the desired metal lines, whereas a portion of the metallic material 140 on top of the photoresist mask 130' comprises overburden material that is subsequently removed using a lift-off step (FIG. 1E).

In one embodiment of the invention, the layer of metallic material 140 is formed of one layer of metallic material, such as Al (aluminum) or some other metallic material that is suitable for the given application. In another embodiment, the layer of metallic material 140 is formed of multiple layers of metallic material such as Ti (Titanium), Pd (Palladium) and Au (Gold). In one example embodiment, the layer of metallic material 140 may comprise a stack of metal layers such as 10/20/30 nm Ti/Pd/Au, and/or other metal layers which are commonly utilized to form metal lines.

Furthermore, in one embodiment of the invention, each layer of metallic material is deposited using a "line-of-sight" deposition method such as evaporation, to achieve a non-conformal deposition where the metallic material is formed primarily on the horizontal surfaces and not on the vertical surfaces of the semiconductor structure. In another embodiment, directional sputtering (e.g., PVD (physical vapor deposition)) techniques can be utilized to deposit the metallic material as the directional sputtering of metals exhibits a non-conformal deposition. By virtue of using a line-of-sight or directional sputtering deposition process to deposit the metallic material, as shown in FIG. 1D, the portion of the metallic material 140 (e.g., metal line) that is formed in the opening 124 of the sacrificial layer 120 is thicker in the center region and tapers down towards the sidewalls of the opening 124, resulting in metal lines with tapered profiles. This variation in the metal stack thickness from the center to the edge within each metal line is a consequence of the fabrication process.

The use of a "line-of-sight" deposition process (or other non-conformal deposition process) to deposit the metallic material 140 essentially prevents metallic material from being coated on the underlying surface of the photoresist overhang structure 134 or on the sidewalls of the laterally etched portion 122 of the sacrificial layer 120. Moreover, as shown in FIG. 1D, the total thickness of the metallic material 140 within the opening 124 of the sacrificial layer 120 is less than the thickness $T_1$ of the sacrificial layer 120 and, more specifically, the metallic material 140 in the opening 124 does not extend into the laterally etched portion 122 of the sacrificial layer 120. By forming the photoresist overhang structure 134, and by keeping the thickness of the metallic material 140 in the opening 124 below the laterally etched portion 122 of the sacrificial layer 120, the deposited metallic material is discontinuous at the locations adjacent the overhand structure 134 and the sidewalls of the laterally etched portion 122 of the sacrificial layer 120. This discontinuity in the metallic material 140 ensures that during a subsequent lift-off step, the upper portion of the sacrificial layer 120 (e.g., the recessed sidewalls of the laterally etched portion 122 of the sacrificial layer 120) would be in contact with a solvent or developer which is used to dissolve the sacrificial layer 120 and cause "lift-off" of the photoresist mask 130', and the overburden metallic material 140 on top of the photoresist mask 130'.

For example, FIG. 1E is cross-sectional schematic view of the semiconductor structure of FIG. 1D after dissolving the sacrificial layer 120 to cause lift-off of the photoresist mask 130 and the overburden metallic material 140 disposed on the photoresist mask 130'. In one embodiment of the invention, lift-off is achieved by immersing the semiconductor structure shown in FIG. 1D in a solvent that dissolves the sacrificial layer 120 and possibly the photoresist mask 130' at the same time. The lift-off process can be accelerated using ultrasonic agitation and heating of the solvent bath. The overburden metallic material 140 that covers the photoresist mask 130' is essentially "lifted-off" as the solvent proceeds to dissolve the underlying sacrificial layer 120 and/or the photoresist mask 130'. FIG. 1E illustrates an embodiment where the sacrificial layer 120 is dissolved using a photoresist developer solution to achieve lift-off of overburden metallic material 140 on the photoresist mask 130', while leaving the metallic material 140 to form a metal line. In this process, the photoresist mask 130' is not dissolved by the photoresist developer solution, and the overburden metallic material 140 and the photoresist mask 130' are lifted-off as one layer. In another embodiment, lift-off is achieved by dissolving only the photoresist mask 130' using, e.g., acetone, while leaving the sacrificial layer 120 (e.g. DBARC) for use as an insulating layer that encapsulates the metal lines.

It is to be appreciated that lift-off techniques according to embodiments of the invention as described herein process allow the thickness of the sacrificial layer to be decoupled from the size of the overhang structure, which allows the thickness of the sacrificial layer to be decoupled from the undercut length and therefore allow thick metal lines to be formed with a tight pitch. Indeed, in a conventional lift-off process, starting with the semiconductor structure as shown in FIG. 1B, for example, the sacrificial layer 120 would be etched down to the substrate 110 using an isotropic etch process. In this regard, using a conventional process, the length $L_1$ of the undercut would be equal to the thickness $T_1$ of the sacrificial layer 120. As such, the use of a thick sacrificial material (to obtain a thick metal line) would lead to a large lateral photoresist overhang, which would limit how close two metal lines can be. In particular, in a conventional process, the minimum distance between two adjacent metal lines would need to be at least two times the length $L_1$ of the overhang which, as a result of the isotropic etch process, would be 2× the thickness $T_1$ of the sacrificial layer 120, otherwise the portion of the photoresist mask 130' separating two adjacent metal lines would collapse.

In contrast, in the exemplary lift-off process as discussed above according to an embodiment of the invention, an initial isotropic etch process is utilized to slightly etch the sacrificial layer 120 and undercut the photoresist mask 130' to create a small photoresist overhang structure 134. Thereafter, an anisotropic etch process (e.g., RIE) is utilized to etch the sacrificial layer 120 down to the substrate 110 using the photoresist mask 130'. With this process, the use of, e.g., RIE, effectively decouples the amount of the undercutting of the sacrificial layer 120 (under the photoresist mask 130') from the thickness $T_1$ of the sacrificial layer 120 since $L_1$ can be much less than $T_1$ (as opposed to the conventional process where $L_1 = T_1$). As such, a lift-off process according to an embodiment of the invention enables the formation of thick metal lines at tight pitches.

FIGS. 2A, 2B, 2C, 2D, 2E and 2F schematically illustrate a lift-off method for patterning metallic lines on a substrate, according to another embodiment of the invention. The lift-off process of FIGS. 2A-2F is similar to the lift-off process of FIGS. 1A-1E as discussed above, except that the lift-off process shown in FIGS. 2A-2F utilizes another sacrificial layer (e.g., ARC (anti reflective coating) layer) to provide a higher level of control in the process of recessing the sacrificial layer (e.g., DBARC layer).

Figure 2A:
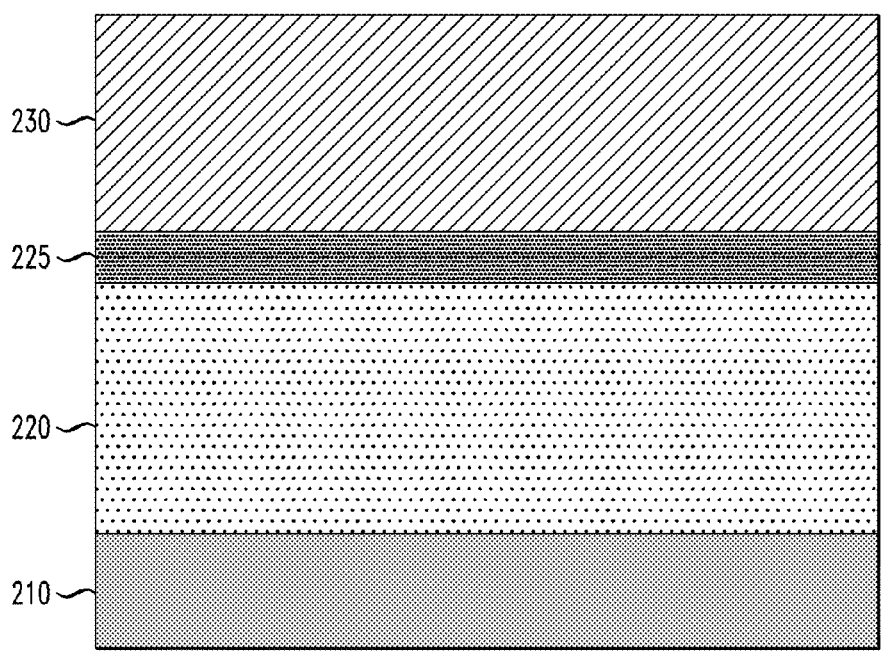

In particular, referring initially to FIG. 2A, a semiconductor structure 200 is shown at an intermediate stage of fabrication in which the semiconductor structure 200 comprises a substrate 210, a first layer of sacrificial material 220, a second layer of sacrificial material 225, and a layer of photoresist material 230. In one embodiment of the invention, the substrate 210, the first sacrificial layer 220 and the photoresist layer 230 are similar to the substrate 110, the sacrificial layer 120 and the photoresist layer 130, respectively, as discussed above with reference to FIG. 1A, for example. In the embodiment of FIG. 2A, the second sacrificial layer 225 is formed of a material (e.g., ARC material) that is not dissolved by the photoresist developer solution which is used to form a photoresist mask, which allows the development of the photoresist layer 230 and the recess of the sacrificial layers 225 and 220 to be performed independently and separately.

Figure 2B:
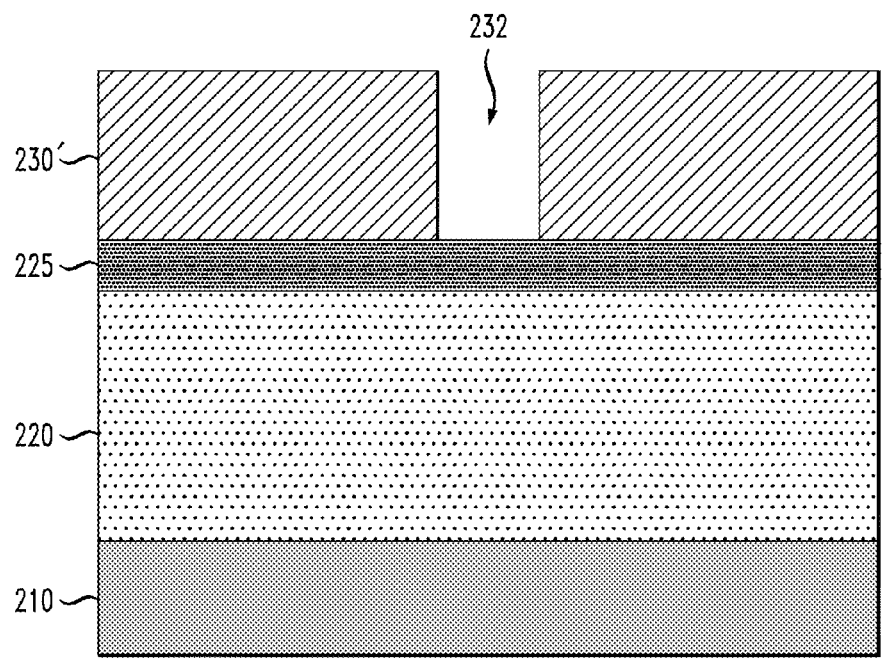

For example, FIG. 2B is cross-sectional schematic view of the semiconductor structure of FIG. 2A after photolithographically patterning the photoresist layer 230 to form a photoresist mask 230' having an opening 232. During the development of the photoresist layer 230, the opening 232 is formed, but the second sacrificial layer 225 is not etched as the material of the second sacrificial layer 225 (e.g., ARC material) is selected to be insoluble to the developer solution. Since the second sacrificial layer 225 does not dissolve in the developer, the underlying first sacrificial layer 220 (e.g., DBARC layer) remains intact.

Figure 2C:
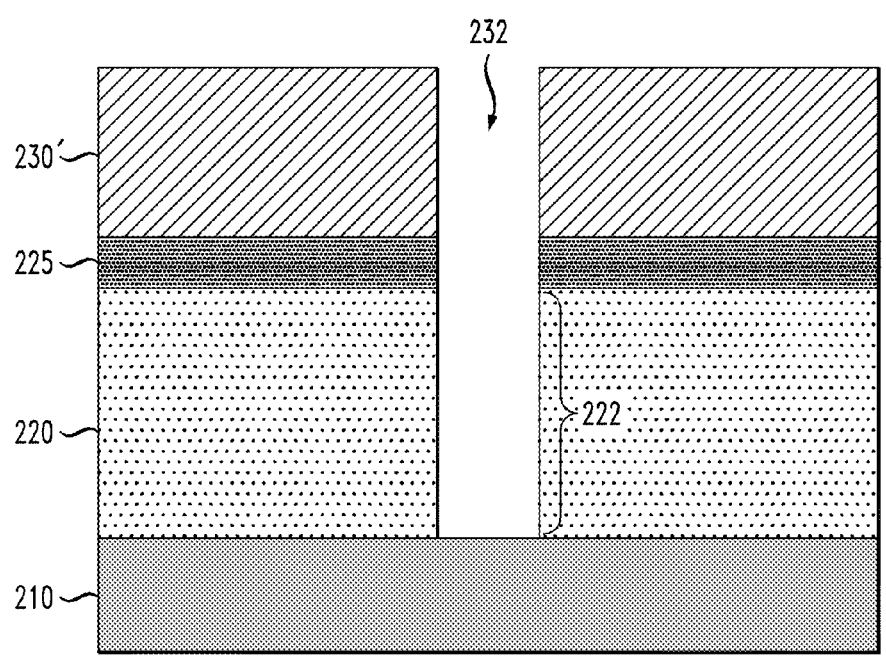

Next, the sacrificial layers 225 and 220 are anisotropically etched using the photoresist mask 240' to form an opening 222 in the first sacrificial layer 220 down to the substrate 210. For example, FIG. 2C is cross-sectional schematic view of the semiconductor structure of FIG. 2B after anisotropically etching portions of the sacrificial layers 225 and 220, which are exposed through the opening 232 in the photoresist mask 230', down to the substrate 210. In one embodiment of the invention, the sacrificial layers 225 and 220 are anisotropically etched using RIE, which provides directional (vertical) etching so that the sacrificial layers 225 and 220 are etched from the top downwards with minimal etching in the lateral direction. As noted above, the use of an $O_2$ etch chemistry ensures that the sidewalls of the first sacrificial layer 220 (e.g., DBARC layer) remain clean and are not chemically modified, so that the first sacrificial layer 220 can be subsequently dissolved using a developer.

Figure 2D:
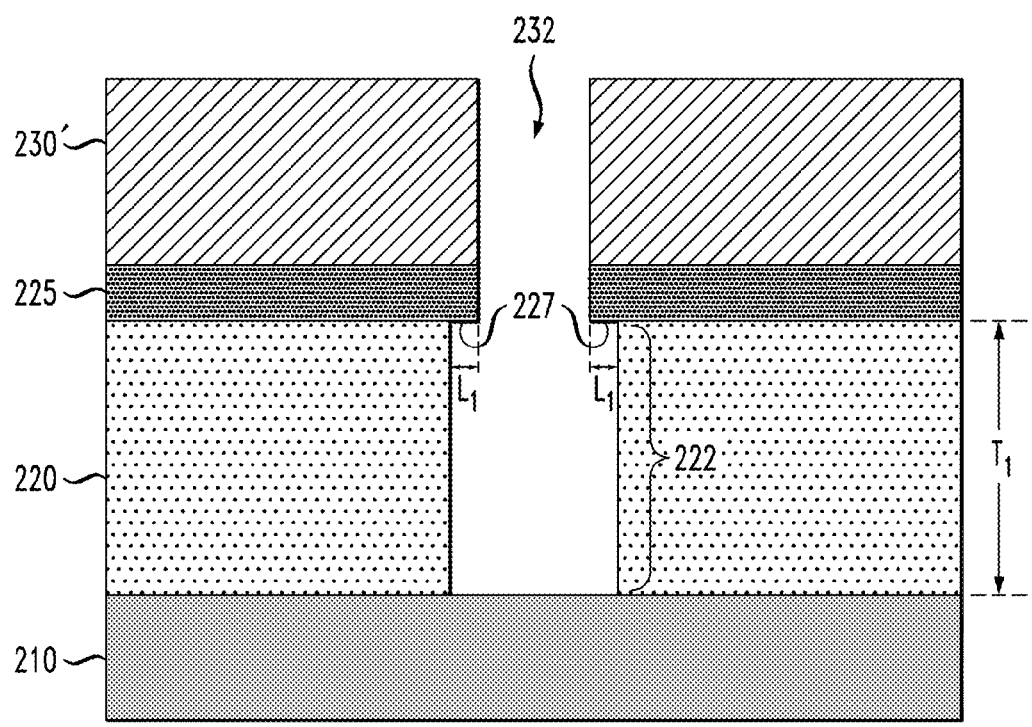

Next, the semiconductor structure of FIG. 2C is immersed in a developer solution to laterally etch the exposed sidewalls that define the opening 222 in the first sacrificial layer 220. In particular, FIG. 2D is cross-sectional schematic view of the semiconductor structure of FIG. 2C after laterally etching the exposed sidewalls of the opening 220 to undercut the second sacrificial layer 225 and form an overhang structure 227. As shown in FIG. 2D, the sidewalls of the opening 222 in the first sacrificial layer 220 are laterally etched to form an undercut of length $L_1$ in the sacrificial layer 220 below the photoresist mask 230' and second sacrificial layer 225 around a bottom periphery of the opening 232. The lateral etching results in the formation of the photoresist/sacrificial overhang structure 227. In one embodiment of the invention, the exposed sidewalls of the first sacrificial layer 220 are laterally etched to achieve an undercut length $L_1$ of about 15 nm to about 30 nm, for example, which is much less than the thickness $T_1$ of the first sacrificial layer 220. In the lateral etch process depicted in FIG. 2D, the photoresist mask 230' and the second sacrificial layer 225 (e.g., ARC layer) are not dissolved by the developer solution that is used to laterally recess the exposed sidewalls of the first sacrificial layer 220 (e.g., DBARC layer).

Figure 2E:
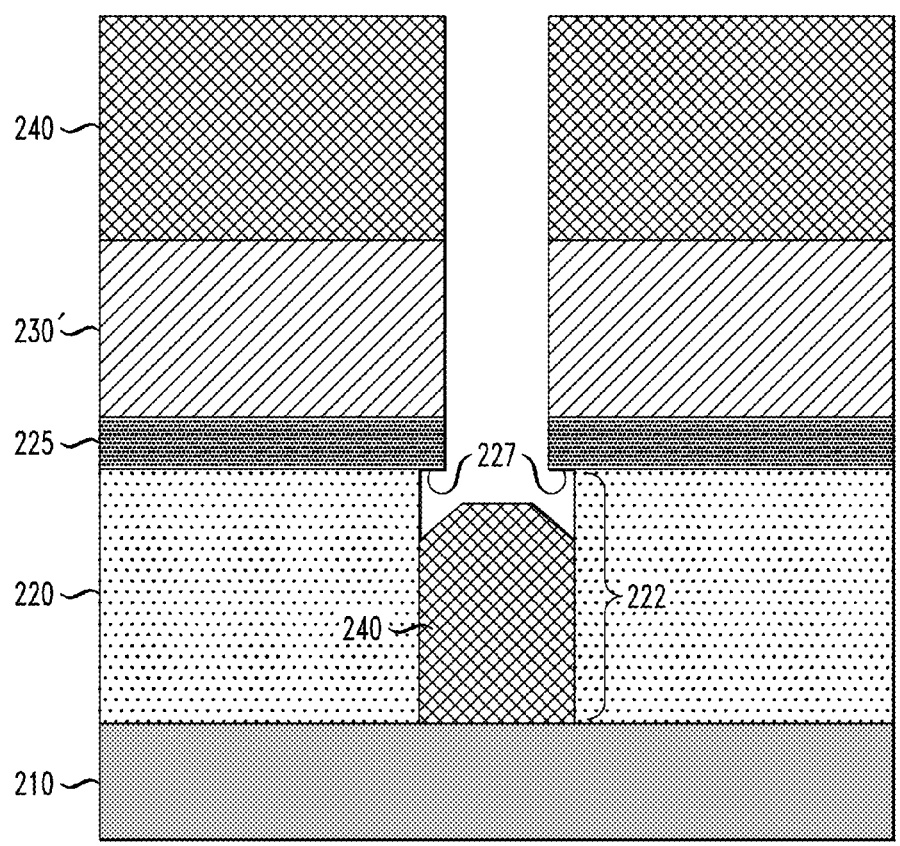

A next phase in the lift-off process comprises depositing metallic material over the semiconductor structure to FIG. 2D to at least partially (or completely) fill the opening 222 in the first sacrificial layer 220 with metallic material that forms metal lines. In particular, FIG. 2E is cross-sectional schematic view of the semiconductor structure of FIG. 2D after depositing one or more non-conformal layers of metallic material 240 over the semiconductor structure to at least partially fill the opening 222 in the first sacrificial layer 220 with the metallic material 240. The portion of the metallic material 240 that fills the opening 222 in the first sacrificial layer 220 forms the desired metal lines, whereas a portion of the metallic material 240 on top of the photoresist mask 230' comprises overburden material that is subsequently removed using a lift-off step (FIG. 2F).

In one embodiment of the invention, the layer of metallic material 240 is formed of one or more layers of metallic material, as discussed above with reference to FIG. 1D. In addition, each layer of metallic material is deposited using, e.g., "line-of-sight" or directional sputtering deposition methods as discussed above with reference to FIG. 1D to essentially prevents metallic material from being coated on the underlying surface of the overhang structure 227 or on the exposed upper portions of the recessed sidewalls of the first sacrificial layer 220 just below the overhang structure 227. Moreover, as shown in FIG. 2E, the total thickness of the metallic material 240 within the recessed opening 222 of the first sacrificial layer 220 is less than the thickness $T_1$ of the first sacrificial layer 220. By forming the overhang structure 227, and by keeping the thickness of the metallic material 240 in the opening 222 below the second sacrificial layer 225, the deposited metallic material is discontinuous exposed upper portions of the recessed sidewalls of the first sacrificial layer 220 just below the overhang structure 227.

This discontinuity in the metallic material 240 ensures that during a subsequent lift-off step, the upper portion of the recessed sidewalls of the first sacrificial layer 220 (which undercut the second sacrificial layer 225 and photoresist mask 230') would be in contact with a solvent or developer which is used to dissolve the first sacrificial layer 220 and cause "lift-off" of the second sacrificial layer 225, the photoresist mask 230', and the overburden metallic material 240 on top of the photoresist mask 230'.

Figure 2F:
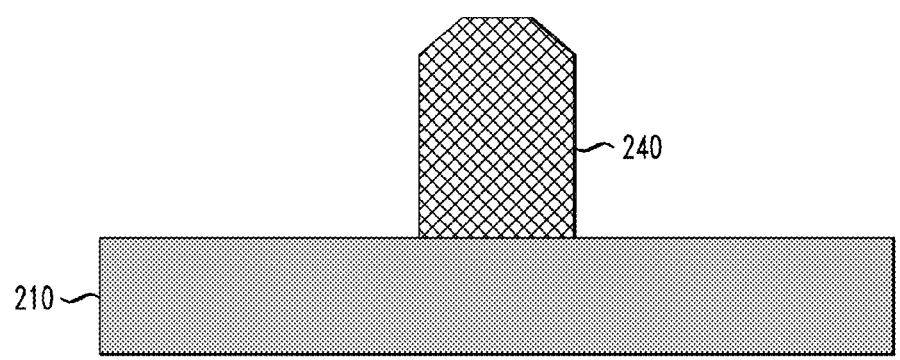

For example, FIG. 2F is cross-sectional schematic view of the semiconductor structure of FIG. 2E after dissolving the first sacrificial layer 220 to cause "lift-off" of the second sacrificial layer 225, the photoresist mask 230', and the overburden metallic material 240 on top of the photoresist mask 230'. In one embodiment of the invention, lift-off is achieved by immersing the semiconductor structure shown in FIG. 2E in a solvent that at the very least, dissolves the first sacrificial layer 220 to remove the overlying layers 225, 230', and 240. The lift-off process can be accelerated using ultrasonic agitation and heating of the solvent bath. The overburden metallic material 240 that covers the photoresist mask 230' is essentially "lifted-off" as the solvent proceeds to dissolve the underlying first sacrificial layer 220 and/or the second sacrificial layer 225. FIG. 2F illustrates an embodiment where the first sacrificial layer 220 is dissolved to achieve lift-off, while leaving the metallic material 240 on the substrate 210 to form a metal line. In another embodiment, lift-off is achieved by dissolving the second sacrificial layer 225 and possibly the photoresist mask 230', while leaving the first sacrificial layer 220 in place for use as an insulating layer that encapsulates the metal lines.

FIGS. 3A, 3B, 3C, 3D, 3E and 3F schematically illustrate a lift-off method for patterning metallic lines on a substrate, according to yet another embodiment of the invention. The lift-off process schematically shown in FIGS. 3A-3F is similar to the lift-off process schematically shown in FIGS. 2A-2F as discussed above, except that the lift-off process schematically shown in FIGS. 3A-3F utilizes a photopatternable DBARC material in place of the ARC material for the second sacrificial layer to prevent etching of the underlying first sacrificial layer 220 during development of the photoresist layer 230.

Figure 3A:
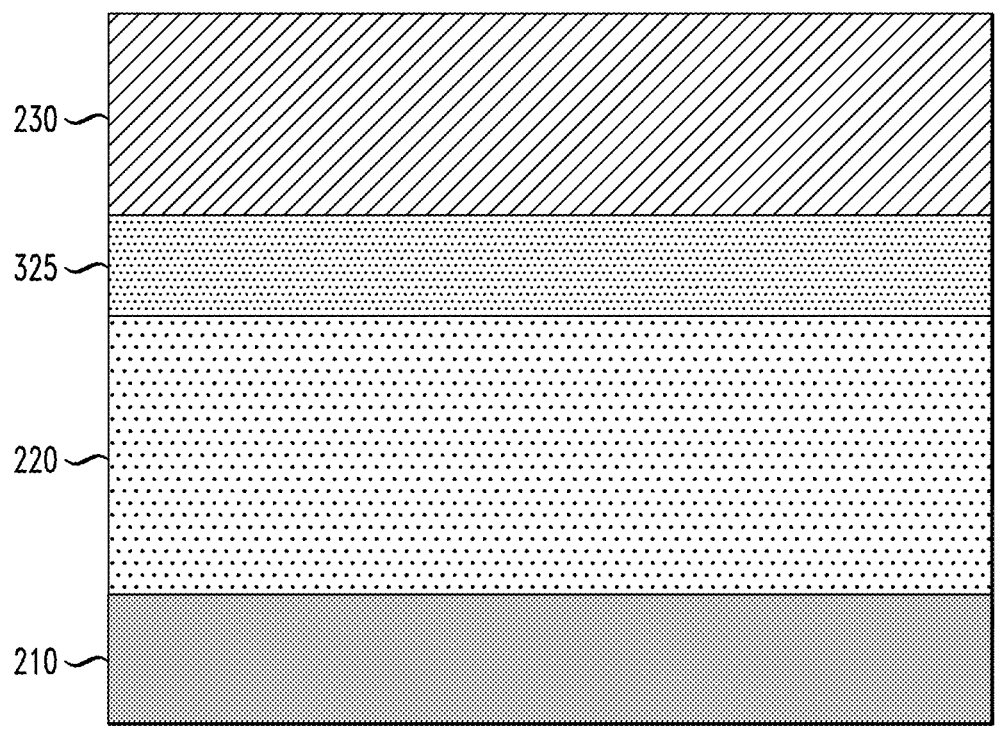
Figure 3B:
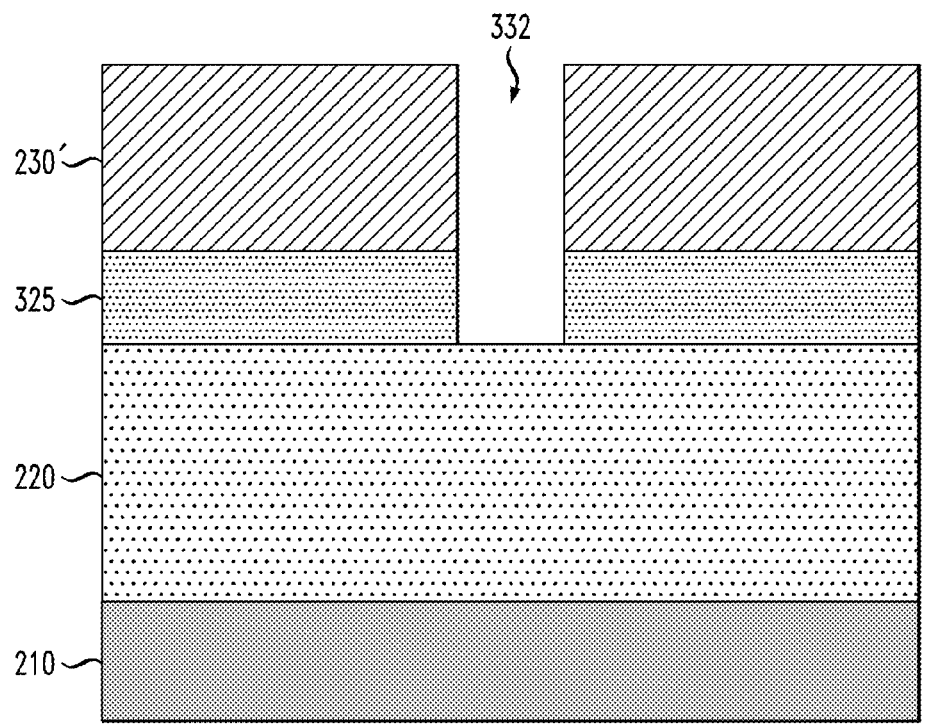

In particular, referring initially to FIG. 3A, a semiconductor structure 300 is shown at an intermediate stage of fabrication in which the semiconductor structure 300 comprises a substrate 210, a first layer of sacrificial material 220, a second layer of sacrificial material 325, and a layer of photoresist material 230, wherein the substrate 210 and the layers 220 and 230 are similar to those features/layers discussed above with reference to, e.g., FIG. 2A. However, in the embodiment of FIG. 3A, the second sacrificial layer 325 is formed of a photosensitive DBARC material (e.g., a commercially available 193-nm BARC such as DS-A520), as opposed to an ARC material as in the previously discussed embodiment. We have experimentally verified that when the photoresist layer 230 is exposed and developed, the photosensitive BARC material (e.g., DS-A520 film) is also exposed and developed similar to the photoresist layer 230, but the top portion of the sacrificial material 220 (DUV-DBARC) does not dissolve in the developer For example, FIG. 3B is cross-sectional schematic view of the semiconductor structure of FIG. 3A after simultaneously photolithographically patterning the photoresist layer 230 and the second sacrificial layer 325 to form an etch mask 230'/325 comprising an opening 332. When developing the exposed layers 230 and 325, the opening 332 is formed down to the first sacrificial layer 220, but the developer solution does not dissolve the first sacrificial layer 220 (e.g., DBARC material). It is believed that the coating of the second sacrificial layer 325 (with a DA-A520 photopatternable DBARC film) over the first sacrificial layer 220 (e.g., DBARC layer) serves to "poison" an upper surface of the first sacrificial layer 220 so that the upper surface of the first sacrificial layer 220 is insoluble in the developer solution used to develop the photosensitive layers 230 and 325. In this regard, the photopatternable BARC material of the second sacrificial layer 325 serves to prevent the photoresist developer from attacking the first sacrificial layer 220 (DBARC layer).

Figure 3C:
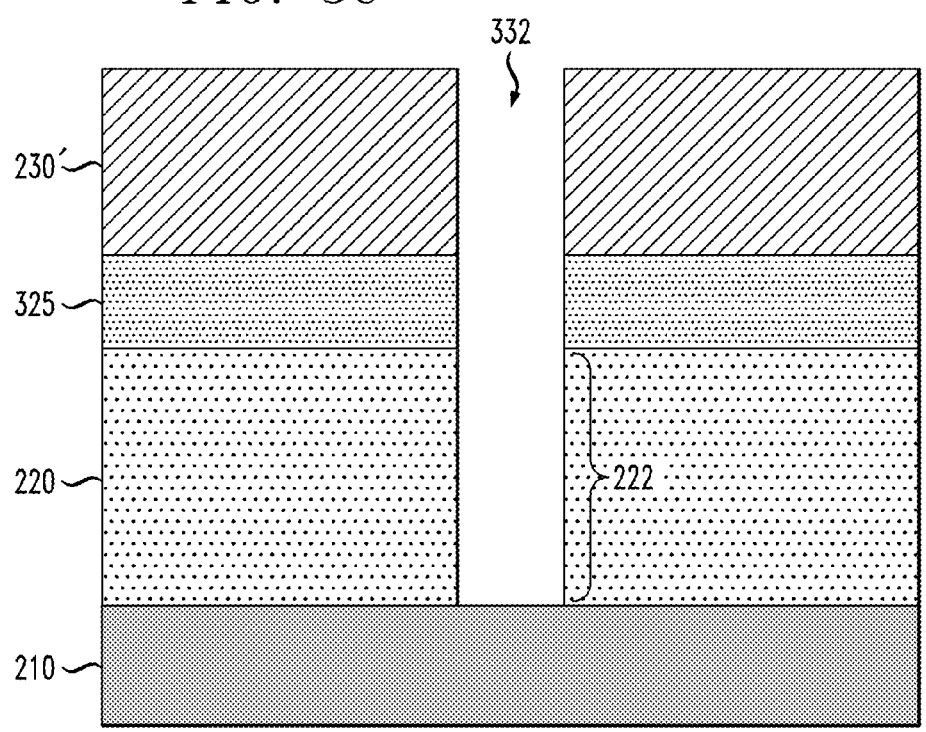

Next, the first sacrificial layer 220 is anisotropically etched through the opening 332 formed in the photoresist mask 230' and second sacrificial layer 325 to form the opening 222 in the first sacrificial layer 220 down to the substrate 210. For example, FIG. 3C is cross-sectional schematic view of the semiconductor structure of FIG. 3B after anisotropically etching a portion of the first sacrificial layer 220, which are exposed through the opening 332 in the photoresist mask 230' and second sacrificial layer 325, down to the substrate 210. In one embodiment of the invention, the first sacrificial layer is anisotropically etched using RIE, as in the previous embodiments discussed above.

Figure 3D:
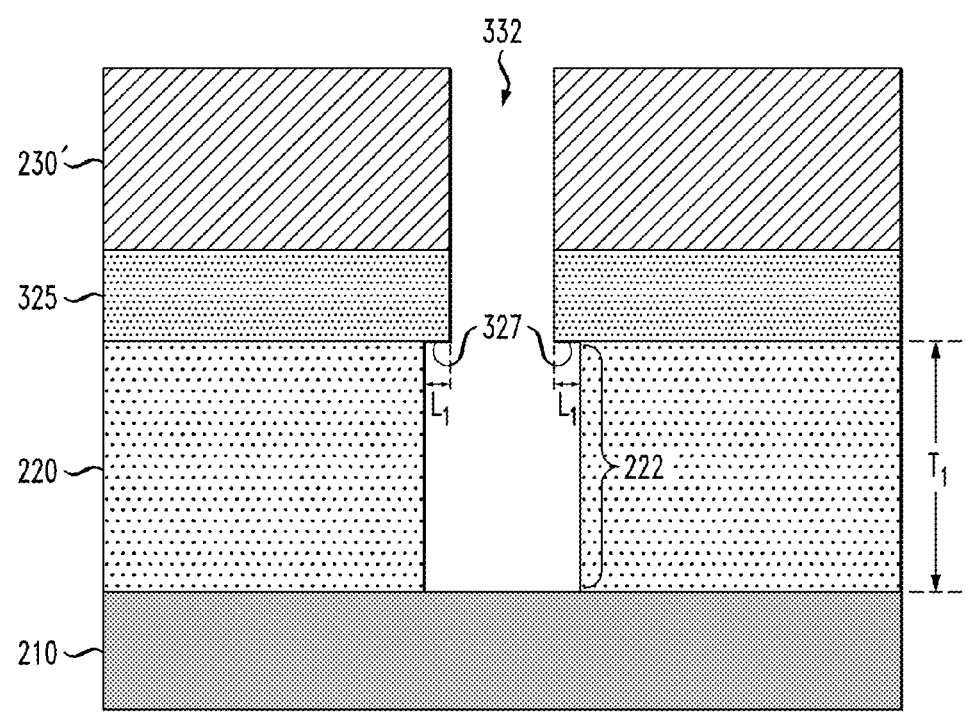

Next, the semiconductor structure of FIG. 3C is immersed in a developer solution to laterally etch the exposed sidewalls that define the opening 222 in the first sacrificial layer 220. In particular, FIG. 3D is cross-sectional schematic view of the semiconductor structure of FIG. 3C after laterally etching the exposed sidewalls of the opening 220 to undercut the second sacrificial layer 325 and form an overhang structure 327. As shown in FIG. 3D, the sidewalls of the opening 222 in the first sacrificial layer 220 are laterally etched to form an undercut of length $L_1$ in the sacrificial layer 220 below the photoresist mask 230' and second sacrificial layer 325 around a bottom periphery of the opening 332. The lateral etching results in the formation of the photoresist/sacrificial overhang structure 327. In one embodiment of the invention, the exposed sidewalls of the first sacrificial layer 220 are laterally etched to achieve an undercut length $L_1$ of about 15 nm to about 30 nm, for example, which is much less than the thickness $T_1$ of the first sacrificial layer 220. In the lateral etch process depicted in FIG. 3D, the photoresist mask 230' and the second sacrificial layer 325 (e.g., photopatternable DBARC layer) are not dissolved by the developer solution that is used to laterally recess the exposed sidewalls of the first sacrificial layer 220 (e.g., DBARC layer).

Figure 3E:
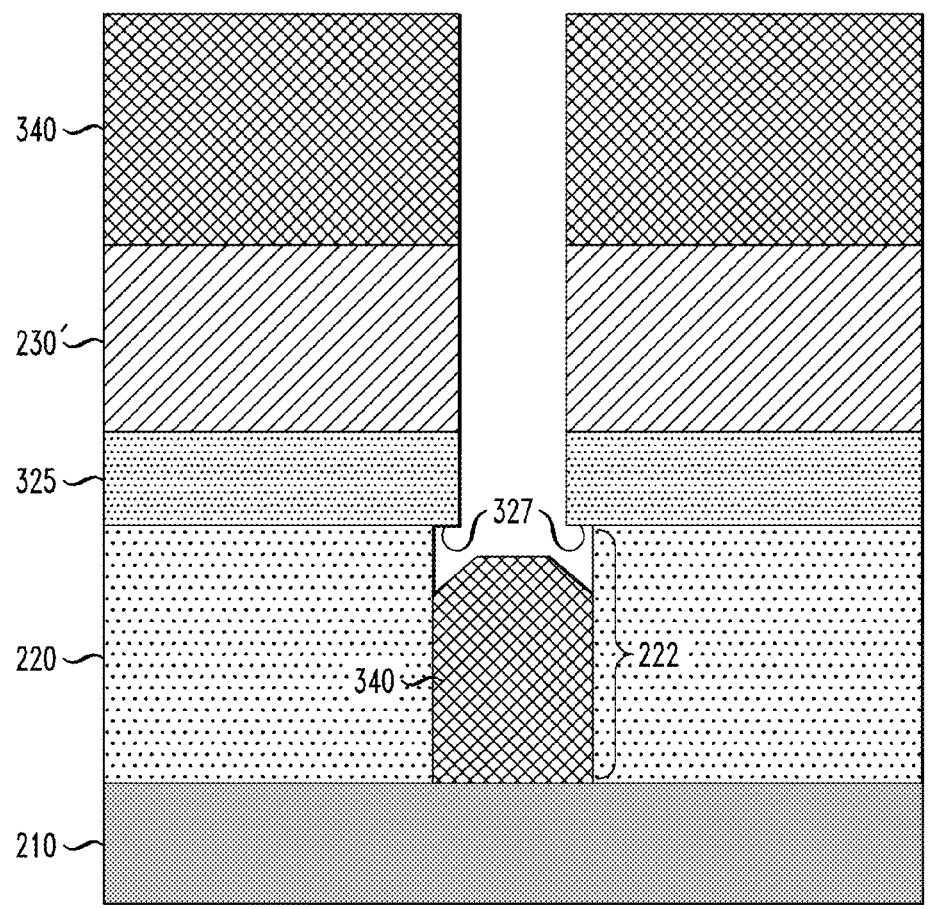

A next phase in the lift-off process comprises depositing metallic material over the semiconductor structure to FIG. 3D to at least partially (or completely) fill the opening 222 in the first sacrificial layer 220 with metallic material that forms metal lines. In particular, FIG. 3E is cross-sectional schematic view of the semiconductor structure of FIG. 3D after depositing one or more non-conformal layers of metallic material 340 over the semiconductor structure to at least partially fill the opening 222 in the first sacrificial layer 220 with the metallic material 340. The portion of the metallic material 340 that fills the opening 222 in the first sacrificial layer 220 forms the desired metal lines, whereas a portion of the metallic material 340 on top of the photoresist mask 230' comprises overburden material that is subsequently removed using a lift-off step (FIG. 3F).

In one embodiment of the invention, the layer of metallic material 340 is formed of one or more layers of metallic material, as discussed above with reference to FIG. 1D. In addition, each layer of metallic material is deposited using, e.g., "line-of-sight" or directional sputtering deposition methods as discussed above with reference to FIG. 1D to essentially prevents metallic material from being coated on the underlying surface of the overhang structure 327 or on the exposed upper portions of the recessed sidewalls of the first sacrificial layer 220 just below the overhang structure 327. Moreover, as shown in FIG. 3E, the total thickness of the metallic material 340 within the recessed opening 222 of the first sacrificial layer 220 is less than the thickness $T_1$ of the first sacrificial layer 220. By forming the overhang structure 327, and by keeping the thickness of the metallic material 340 in the opening 222 below the second sacrificial layer 225, the deposited metallic material is discontinuous exposed upper portions of the recessed sidewalls of the first sacrificial layer 220 just below the overhang structure 327. This discontinuity in the metallic material 340 ensures that during a subsequent lift-off step, the upper portion of the recessed sidewalls of the first sacrificial layer 220 (which undercut the second sacrificial layer 325 and photoresist mask 230') would be in contact with a solvent or developer which is used to dissolve the first sacrificial layer 220 and cause "lift-off" of the second sacrificial layer 325, the photoresist mask 230', and the overburden metallic material 340 on top of the photoresist mask 230'.

Figure 3F:
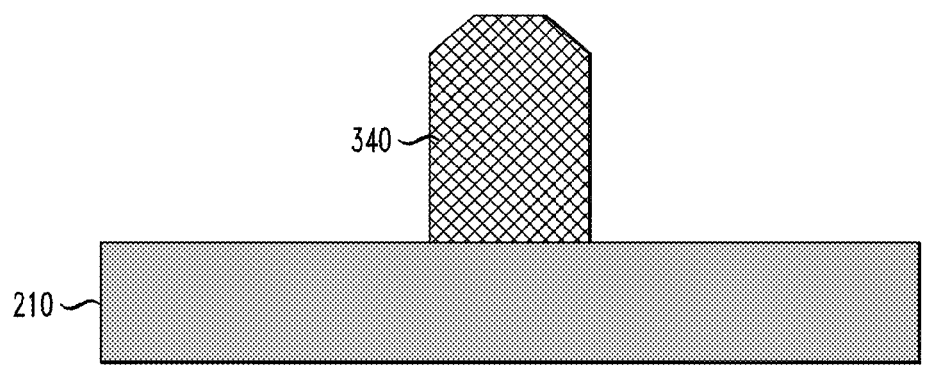

For example, FIG. 3F is cross-sectional schematic view of the semiconductor structure of FIG. 3E after dissolving the first sacrificial layer 220 to cause "lift-off" of the second sacrificial layer 325, the photoresist mask 230', and the overburden metallic material 340 on top of the photoresist mask 230'. In one embodiment of the invention, lift-off is achieved by immersing the semiconductor structure shown in FIG. 3E in a solvent that at the very least, dissolves the first sacrificial layer 220 to remove the overlying layers 325, 230', and 340. The lift-off process can be accelerated using ultrasonic agitation and heating of the solvent bath. The overburden metallic material 340 that covers the photoresist mask 230' is essentially "lifted-off" as the solvent proceeds to dissolve the underlying first sacrificial layer 220 and/or the second sacrificial layer 325. FIG. 3F illustrates an embodiment where the first sacrificial layer 220 is dissolved to achieve lift-off, while leaving the metallic material 340 on the substrate 210 to form a metal line. In another embodiment, lift-off is achieved by dissolving the second sacrificial layer 325 and possibly the photoresist mask 230', while leaving the first sacrificial layer 220 in place for use as an insulating layer that encapsulates the metal lines.

FIGS. 4A, 4B, 4C, 4D, 4E, 4F, and 4G schematically illustrate a lift-off method for patterning metallic lines on a substrate, according to another embodiment of the invention. The lift-off process schematically shown in FIGS. 4A-4G utilizes a hard mask layer that serves to decouple a thickness of photoresist layer from a thickness of a sacrificial material layer to allow the use of a thin photoresist layer to achieve good pattern definition, while at the same time allowing a thick sacrificial layer of DBARC material to be etched and enable the fabrication of thick metal lines. In particular, referring initially to FIG. 4A, a semiconductor structure 400 is shown at an intermediate stage of fabrication in which the semiconductor structure 400 comprises a substrate 210, a first layer of sacrificial material 220, a second layer of sacrificial material 325, a hard mask layer 410 and a thin layer of photoresist material 230. In one embodiment of the invention, the substrate 210, the first sacrificial layer 220, the second sacrificial layer 325, and the photoresist layer 230 are the same or similar features of previous embodiments discussed above.

Figure 4A:
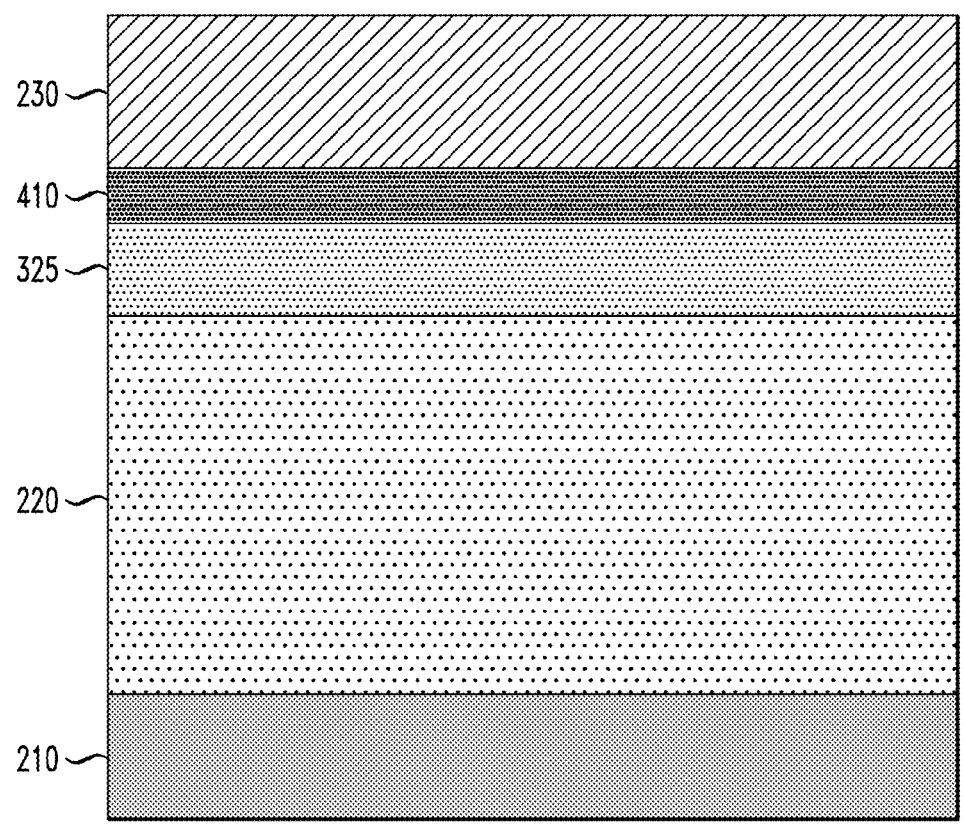

In the embodiment of FIG. 4A, the hard mask layer 410 is disposed between the second sacrificial layer 325 and the photoresist layer 230 and is formed with a material (e.g., Si-ARC, Ti-ARC, etc.) that has an etch property that it is very selective to the chemistry used to etch the underlying sacrificial layers 325 and 220 (e.g., DBARC layers) using RIE. For example, when 1 nm of DBARC material is removed by RIE, only 0.01 nm (or less) of hard mask material is removed. The use of the hard mask layer 410 to provide high etch selectivity with regard to the underlying sacrificial layers 325 and 220 enables the use of a thin photoresist layer 230 to achieve good pattern definition, while being able to sufficiently etch the total thickness of the sacrificial layers 325 and 220 via RIE, even if the photoresist layer is completely depleted prior to the completion of the RIE of the sacrificial layers 325 and 220. Indeed, a typical selectivity of photoresist with respect to DBARC material is about 1 to 1, which means that 1 nm of photoresist material is consumed during RIE for each 1 nm of DBARC that is removed.

Figure 4B:
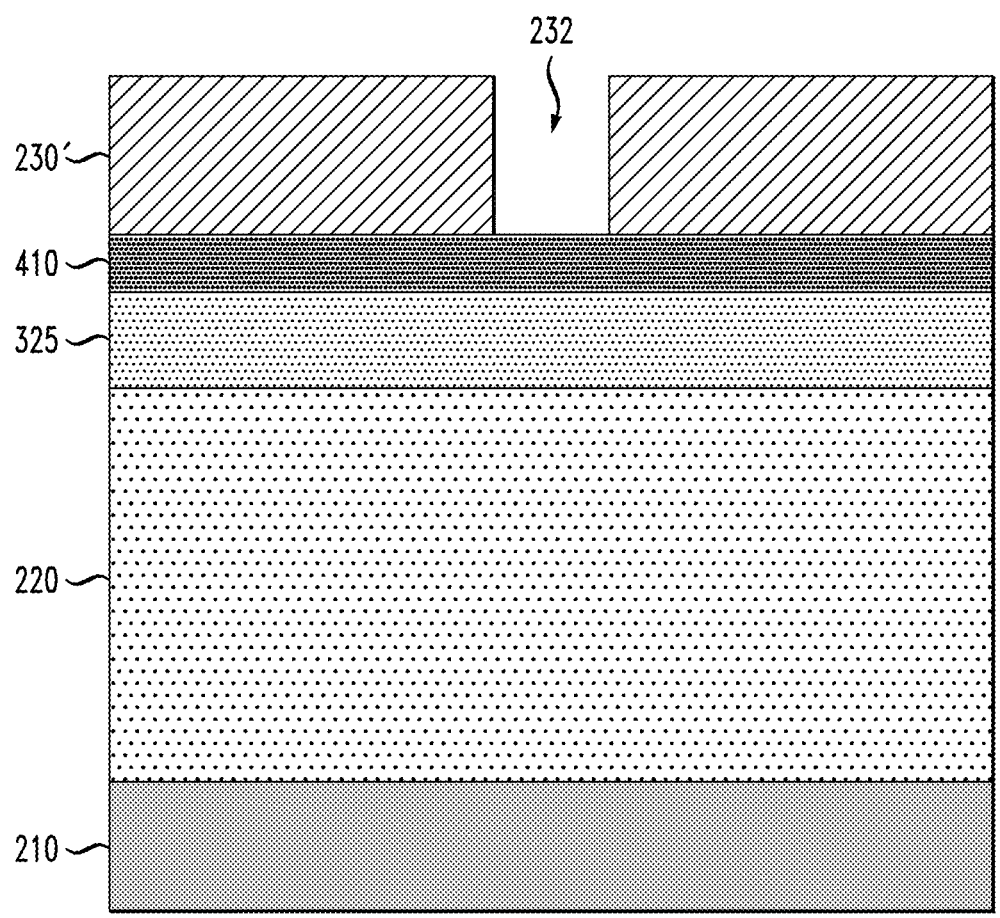
Figure 4C:
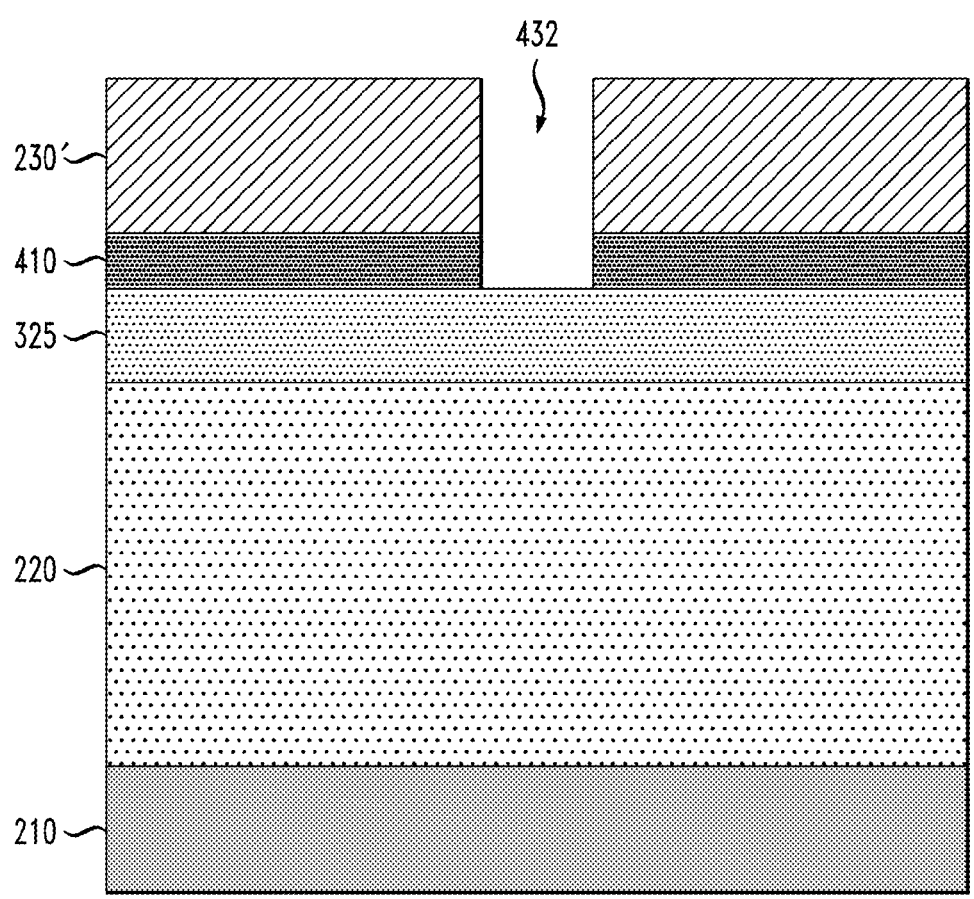

When utilizing the hard mask layer 410 (e.g. Si-ARC), an initial step includes photolithographically patterning the photoresist layer 230 to form a photoresist mask. For example, FIG. 4B is a schematic view of the semiconductor structure of FIG. 4A after photolithographically patterning the photoresist layer 230 to form a photoresist mask 230' having an opening 232 that exposes a portion of the hard mask layer 410. While the photoresist layer 230 is being developed, the hard mask layer 410 is not dissolved by the photoresist developer solution. Instead, following formation of the photoresist mask 230', a RIE process is utilized, for example, to anisotropically etch away the exposed portion of the hard mask layer 410. For example, FIG. 4C is cross-sectional schematic view of the semiconductor structure of FIG. 4B after anisotropically etching a portion of the hard mask layer 410, which is exposed through the opening 232 of the photoresist mask 230', to form an extended opening 432 through the hard mask layer 410 down to the second sacrificial layer 325.

In one embodiment of the invention, the second sacrificial layer 325 is formed of a photopatternable DBARC material (e.g., a commercially available 193-nm BARC such as DS-A520) similar to the previous embodiment discussed above with reference to FIG. 3A. However, in the embodiment of FIG. 4C, the second sacrificial layer 325 is not photolithographically patterned concurrently with the photoresist layer 230 (as in the previous embodiment discussed above with reference to FIGS. 3A and 3B). Instead, the second sacrificial layer 325 is formed of a photopatternable DBARC material or some other suitable material, which serves as an adhesion layer between the first sacrificial layer 220 and the hard mask layer 410. In other words, in an example embodiment where the first sacrificial layer 220 comprises a DBARC material (e.g., DUV-DBARC material) and the hard mask layer 410 is formed of Si-ARC material, the second sacrificial layer 325 serves as an adhesion layer on which the hard mask layer 410 is formed.

Figure 4D:
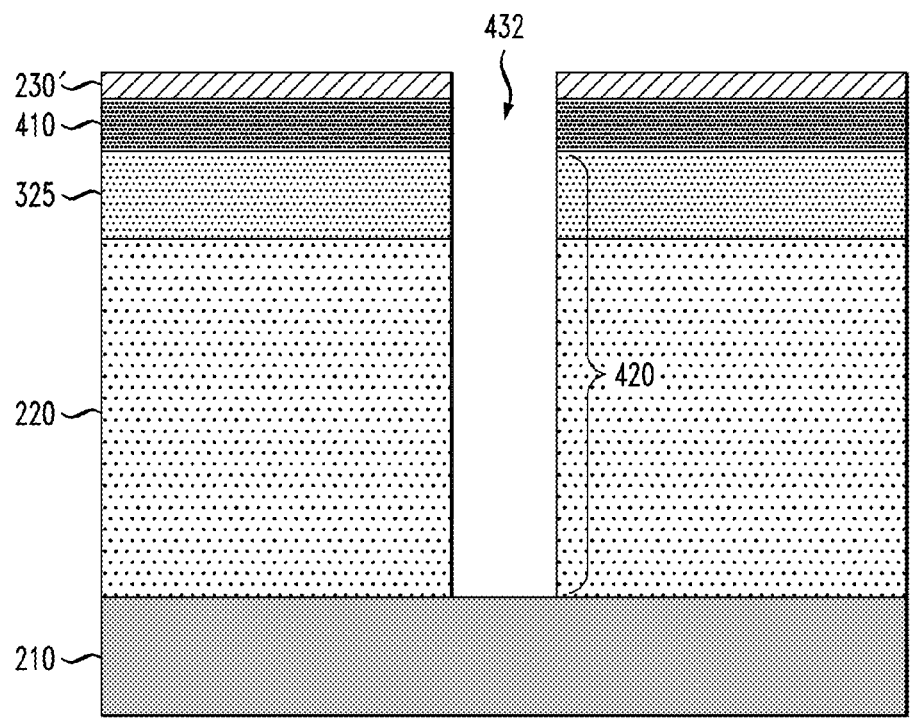

A next step in the exemplary process flow is to anisotropically etch the sacrificial layers 325 and 220 using a RIE process, for example. In particular, FIG. 4D is cross-sectional schematic view of the semiconductor structure of FIG. 4C after anisotropically etching portions of the sacrificial layers 325 and 220, which are exposed through the extended opening 432 of the photoresist mask 230'/hard mask layer 410, to form an opening 420 that extends through the sacrificial layers 325 and 220 down to the substrate 210. In one embodiment of the invention, the sacrificial layers 325 and 220 can be sequentially etched using a single RIE process with suitable etch chemistry, or the sacrificial layers 325 and 220 can be etched with separate RIE processes with different etch chemistries, depending on the materials used to form the sacrificial layers 325 and 220.

As shown in FIG. 4D, the RIE processes that are used to etch the hard mask layer 410 and the sacrificial layers 325 and 220 can result is significant or complete depletion of the photoresist mask 230'. In this regard, since the hard mask layers 410 provide large etch selectivity with regard to the sacrificial layers 325 and 220, the sacrificial layers 325 and 220 are etched at a much higher rate than the hard mask layer 410 (e.g., etched selectivity of 10:1 or greater) such that even if the photoresist mask 230 is completely depleted prior to the completion of the RIE process shown in FIG. 4D, the hard mask layer 410 assumes the function of the etch mask and can be used to etch the thick stack of sacrificial layers 325 and 220 without the complete depletion or loss of the hard mask layers 410.

Figure 4E:
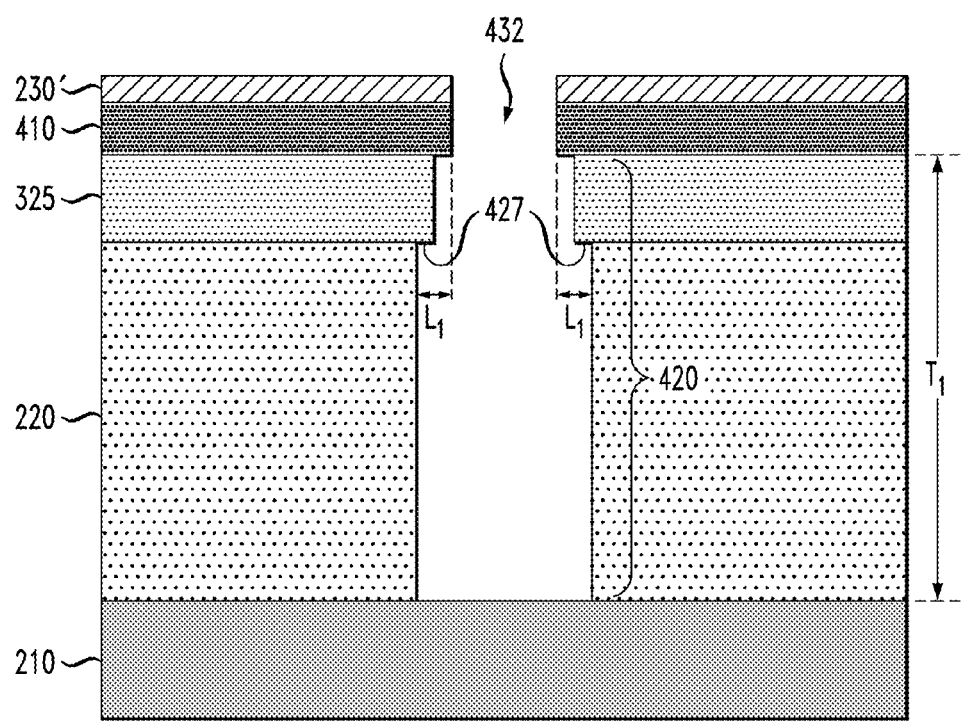

A next step in the exemplary process flow is to laterally etch the exposed sidewall surfaces that define the opening 420 formed through the first and second sacrificial layers 220 and 325. For example, FIG. 4E is cross-sectional schematic view of the semiconductor structure of FIG. 4D after laterally etching the exposed sidewall surfaces of the first and second sacrificial layers 220 and 325, resulting in the formation of undercuts below the hard mask layer 410 that define an overhang structure 427. In one embodiment of the invention, the lateral etching can be achieved using a wet etch process wherein the semiconductor structure of FIG. 4D is immersed in a developer solution. In another embodiment, the lateral etching can be achieved using a dry etch process such as a RIE trim process (e.g., a RIE isotropic etch process) in which the bias is turned down or off, enabling an isotropic RIE etch. By way of example, in one embodiment of the invention, the first and second sacrificial layers 220 and 325 (e.g. DBARC layers) can be etched via RIE using an N2+O2 chemistry to obtain vertical sidewalls. Thereafter, the an RIE trim process using an HBr+O2 RIE etch chemistry can be used to laterally etch the sidewall surfaces of the first and second sacrificial DBARC layers to obtain a desired undercut of length $L_1$.

In some cases, the lateral etch rate of the first and second sacrificial layers 220 and 325 is different, such that the first sacrificial layer 220 laterally etches as a higher rate than the lateral etching of the second sacrificial layer 325, resulting in the stepped overhang structure 427 shown in FIG. 4E. As in all embodiments discussed herein, the exemplary process flow of FIGS. 4D and 4E using the vertical RIE etch followed by the lateral etch, allows the undercut length $L_1$ of the overhang structure 427 to be decoupled from the total thickness $T_1$ of the sacrificial layers 220 and 325. In one embodiment of the invention, the total undercut length $L_1$ shown in FIG. 4E is in a range of about 15 nm to about 30 nm, which is effective to achieve lift-off.

Through experimentation, we have observed that some RIE chemistries may also modify the sidewall properties of the DBARC layers, which can result in a change in the rate that the DBARC material dissolves in a developer solution. For example, the use of a N2+O2 chemistry can render the sidewall surfaces of the DBARC layers to be non-etchable in a developer solution. In yet another example, we found that the use of an HBr+O2 etch chemistry had no measurable effect on the etching rate in the developer.

Figure 4F:
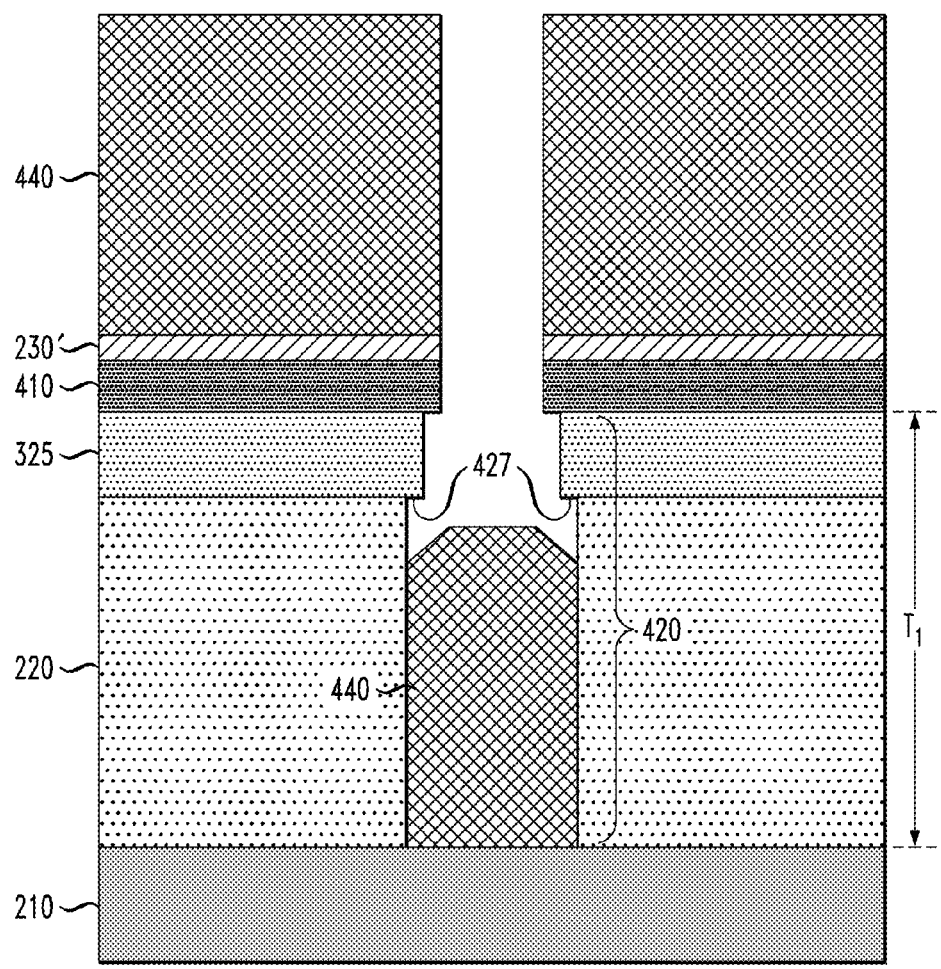

Similar to the previous embodiments discussed above, a next phase in the lift-off process comprises depositing metallic material over the semiconductor structure to FIG. 4E to at least partially fill a portion of the opening 420 with metallic material that forms metal lines. In particular, FIG. 4F is cross-sectional schematic view of the semiconductor structure of FIG. 4E after depositing one or more non-conformal layers of metallic material 440 over the semiconductor structure to at least partially fill the portion of the opening 420 (which is defined by the sidewalls of the first sacrificial layer 220) with the metallic material 440. The portion of the metallic material 440 that is disposed in the opening 420 in the first sacrificial layer 220 forms the desired metal lines, whereas a portion of the metallic material 440 on top of the depleted photoresist mask 230' (or the hard mask layer 410, if the photoresist mask 230' is completely depleted at this stage in the process) comprises overburden material that is subsequently removed using a lift-off step (FIG. 4G).

In one embodiment of the invention, the layer of metallic material 440 is formed of one or more layers of metallic material, as discussed above with reference to FIG. 1D. In addition, each layer of metallic material is deposited using, e.g., "line-of-sight" or directional sputtering deposition methods as discussed above with reference to FIG. 1D to essentially prevent metallic material from being deposited on the underlying surfaces of the overhang structure 427 or on the exposed upper portions of the laterally etched sidewalls of the first sacrificial layer 220 just below the overhang structure 427 or on the exposed laterally etched sidewalls of the second sacrificial layer 325. Moreover, as shown in FIG. 4F, the total thickness of the metallic material 440 within the opening 420 is less than the total thickness $T_1$ of the first and second sacrificial layers 220 and 325 (in particular, in the example embodiment, the thickness of the metallic material 440 is below the second sacrificial layer 325). In this manner, the exposed upper portions of the laterally etched sidewalls of the first sacrificial layer 220 just below the overhang structure 427 and the exposed laterally etched sidewalls of the second sacrificial layer 325 would be in contact with a solvent or developer which is used to dissolve the first sacrificial layer 220 and/or second sacrificial layer 325 and cause "lift-off" of the second sacrificial layer 325, the hard mask layer 410, the photoresist mask 230' (if it still exists), and the overburden metallic material 440 on top of the photoresist mask 230' or the hard mask layer 410.

Figure 4G:
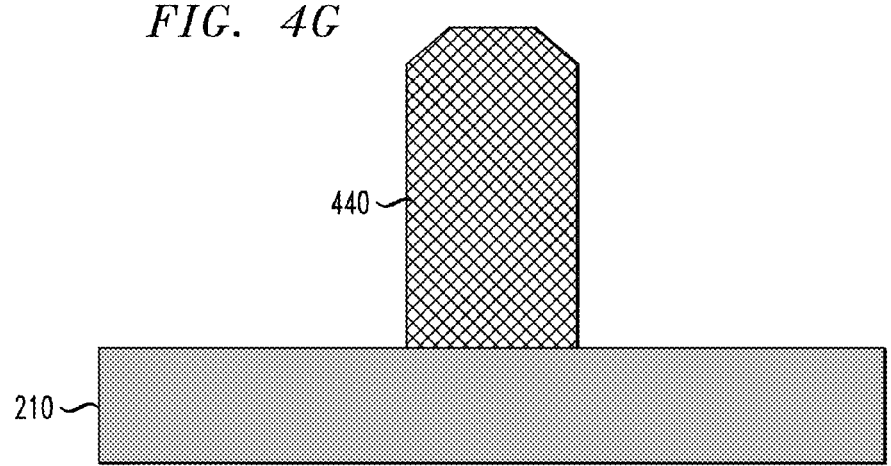

For example, FIG. 4G is cross-sectional schematic view of the semiconductor structure of FIG. 4F after dissolving the first sacrificial layer 220 to cause "lift-off" of the overlying layers to remove the overburden metallic material 440. In one embodiment of the invention, lift-off is achieved by immersing the semiconductor structure shown in FIG. 4F in a solvent that at the very least, dissolves the first sacrificial layer 220 to remove the overlying layers 325, 410. 230', and 440. The lift-off process can be accelerated using ultrasonic agitation and heating of the solvent bath. In another embodiment, lift-off is achieved by dissolving the second sacrificial layer 325 and, while leaving the first sacrificial layer 220 in place for use as an insulating layer that encapsulates the metal lines.

It is to be understood that the methods discussed herein can be incorporated in various semiconductor process flows to fabricate BEOL structures, for example, during early stage development of prototype wafers and semiconductor chips, for example, having analog and digital circuitry or mixed-signal circuitry.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

We claim:
1. A method, comprising:
forming a sacrificial layer on a substrate;
forming a photoresist mask over the sacrificial layer, wherein the photoresist mask comprises an opening;
isotropically etching a portion of the sacrificial layer exposed through the opening of the photoresist mask to form an undercut region in the sacrificial layer below the photoresist mask, wherein the undercut region defines an overhang structure;
anisotropically etching a portion of the sacrificial layer exposed through the opening of the photoresist mask to form an opening through the sacrificial layer down to the substrate;
depositing metallic material to cover the photoresist mask and to at least partially fill the opening formed in the sacrificial layer without coating the overhang structure with metallic material; and
dissolving the sacrificial layer to lift-off the metallic material covering the photoresist mask.

2. The method of claim 1, wherein the sacrificial layer comprises a DBARC (developer-soluble bottom anti-reflective coating) material.

3. The method of claim 1, wherein isotropically etching a portion of the sacrificial layer exposed through the opening of the photoresist mask comprises isotropically etching a portion of the sacrificial layer using a developer solution which is utilized during a development of a layer of photoresist material to form the photoresist mask.

4. The method of claim 1, wherein forming the sacrificial layer on the substrate comprises forming a first sacrificial layer on the substrate and forming a second sacrificial layer on the first sacrificial layer;
wherein anisotropically etching a portion of the sacrificial layer comprises etching an opening through the second and first sacrificial layers down to the substrate; and
wherein isotropically etching a portion of the sacrificial layer comprises laterally etching exposed sidewall surfaces of the first sacrificial layer to undercut the second sacrificial layer and photoresist mask.

5. The method of claim 4, wherein the first sacrificial layer comprises a DBARC (developer-soluble bottom anti-reflective coating) material, and wherein the second sacrificial layer comprises an ARC (anti-reflection coating) material.

6. The method of claim 1, wherein forming the sacrificial layer on the substrate comprises forming a first sacrificial layer on the substrate and forming a second sacrificial layer on the first sacrificial layer;
wherein the first sacrificial layer comprises a DBARC (developer-soluble bottom anti-reflective coating) material,
wherein the second sacrificial layer comprises a photopatternable DBARC material.

7. The method of claim 6, further comprising:
photolithographically patterning the second sacrificial layer concurrently with forming the photoresist mask to extend the opening of the photoresist mask through the second sacrificial layer;
wherein anisotropically etching a portion of the sacrificial layer comprises etching an opening through the first sacrificial layer down to the substrate using the photoresist mask and pattered second sacrificial layer as an etch mask; and
wherein isotropically etching a portion of the sacrificial layer comprises laterally etching exposed sidewall surfaces of the first sacrificial layer to undercut the second sacrificial layer and photoresist mask.

8. The method of claim 1, wherein forming the sacrificial layer on the substrate comprises forming a first sacrificial layer on the substrate and forming a second sacrificial layer on the first sacrificial layer, wherein the first sacrificial layer comprises a DBARC (developer-soluble bottom anti-reflective coating) material, and wherein the second sacrificial layer comprises a photopatternable DBARC material;
wherein the method further comprises forming a hard mask layer between the second sacrificial layer and the photoresist mask.

9. The method of claim 8, wherein the hard mask layer comprises silicon-ARC (anti-reflection coating) material.

10. The method of claim 8, further comprising:
etching the hard mask layer to transfer the opening of the photoresist mask to the hard mask layer;
wherein anisotropically etching a portion of the sacrificial layer comprises etching an opening through the second and first sacrificial layers down to the substrate, which corresponds to the openings in the hard mask layer and the photoresist mask; and
wherein isotropically etching a portion of the sacrificial layer comprises laterally etching exposed sidewall surfaces of the first sacrificial layer to undercut the second sacrificial layer and photoresist mask.

* * * * *